United States Patent [19]

Kinoshita et al.

[11] Patent Number: 4,763,204
[45] Date of Patent: Aug. 9, 1988

[54] SOLID STATE IMAGE PICK-UP DEVICE HAVING A SHUTTER WHICH IS CAPABLE OF STILL AND MOTION PICTURE PHOTOGRAPHY

[75] Inventors: Takao Kinoshita, Tokyo; Akihiko Tojo, Kanagawa; Tsutomu Takayama, Kanagawa; Toshio Kaji, Kanagawa; Nobuyoshi Tanaka, Kanagawa, all of Japan

[73] Assignee: Canon Kabushiki Kaisha, Tokyo, Japan

[21] Appl. No.: 860,513

[22] Filed: May 7, 1986

Related U.S. Application Data

[63] Continuation of Ser. No. 452,500, Dec. 23, 1982, Pat. No. 4,599,657.

[30] Foreign Application Priority Data

| Dec. 29, 1981 | [JP] | Japan | 56-215333 |
| Dec. 29, 1981 | [JP] | Japan | 56-215337 |
| Dec. 29, 1981 | [JP] | Japan | 56-215342 |
| Dec. 29, 1981 | [JP] | Japan | 56-215343 |
| Dec. 29, 1981 | [JP] | Japan | 56-215344 |
| Dec. 29, 1981 | [JP] | Japan | 56-215345 |

[51] Int. Cl.[4] .............................. H04N 5/76
[52] U.S. Cl. .................................... 358/335; 358/906; 358/909; 358/209
[58] Field of Search ............... 358/209, 213, 221, 906, 358/909, 228, 335; 360/33.1, 35.1

[56] References Cited

U.S. PATENT DOCUMENTS

| 4,366,501 | 12/1982 | Tsunekawa et al. | 358/906 X |
| 4,415,937 | 11/1983 | Nishizawa et al. | 358/335 |
| 4,420,773 | 12/1983 | Toyoda et al. | 358/335 |
| 4,499,496 | 2/1985 | Tanaka et al. | 358/213 |

Primary Examiner—Robert L. Richardson
Attorney, Agent, or Firm—Toren, McGeady & Associates

[57] ABSTRACT

An image pick-up device which uses a charge transfer type solid state image pick-up device, and further is provided with a shutter so as to form a high quality picture signal in such a manner that smear is prevented by prohibiting the incidence of light on the device while the charge is being transferred in the device. Further, the device is driven by a clock signal for still photographing in order to obtain a high quality picture information for one frame. Further, the photographing parameter is automatically changed over or the monitor is changed over between the motion picture photographing mode and the still photographing mode.

18 Claims, 11 Drawing Sheets

| a | b | c | | A | B |
|---|---|---|---|---|---|
| 0 | 0 | 0 | PROGRAM MODE | x | y |
| 0 | 0 | 1 | APERTURE PREFERENCE MODE | SET VALUE OF SE3 | y |
| 0 | 1 | 0 | CONTINUOUS MODE | x | 0 |
| 0 | 1 | 1 | SPEED LIGHT MODE | SET VALUE OF SE3 | CONSTANT VALUE OF SE2 |
| 1 | 0 | 0 | STORE TIME PREFERENCE MODE | x | SET VALUE OF SE1 |
| 1 | 0 | 1 | MANUAL MODE | SET VALUE OF SE3 | SET VALUE OF SE1 |

SOLID STATE IMAGE PICK-UP DEVICE HAVING A SHUTTER WHICH IS CAPABLE OF STILL AND MOTION PICTURE PHOTOGRAPHY

This is a continuation application of Ser. No. 452,500, filed Dec. 23, 1982 now U.S. Pat. No. 4,599,657.

BACKGROUND OF THE INVENTION

1. Field of the Invention:

The present invention relates to an image pick-up device suited for one shot image pick-up, particularly, a picture recording device with improved efficiency and able to provide improved picture quality by use of a solid image sensor in combination with a shutter.

2. Description of the Prior Art:

Until now in the case of video cameras using a solid stage image sensor, such as a CCD, the storage, transfer and reading out of the image are carried out at a certain predetermined period.

Consequently, the storage time is constant so that the quality of the picture degrades depending on adverse conditions of an object, such as when the object has a quick motion or high brightness.

Further, even in the case of the conventional frame transfer type CCD, for example, when a strong light falls incident on the light sensing part while the charge formed in the light sensing part is being transferred to the storage portion, the light is superposed on the charge during the transfer as noise over a wide range, which causes a smear phenomenon and degraces the picture quality.

Further, in the case of an interline transfer type CCD, although the vertical shift register is shaded, thereby light of long wavelength falls obliquely incident upon the substrate under the vertical shift register so as to produce minority carries so that there is a possiblity of smear in the same way. Particularly, in the case of the interline transfer type, the charge in the vertical register is normally transferred by 1 bit at every horizontal period of the TV signal so that the above problem is very likely to take place.

Further, the device in which an overflow drain gate is provided beside each picture element so as to cut out the charge in the light sensing part in order to control the storage timing and the storage time of the photo electrons and to transfer the stored charge periodically, is known.

In this way, it is possible not only to read out the signal at the TV rate but also to optionally set the storage time. However, if the storage time is shortened in this case, the S/N becomes remarkably inferior as described above in case smear takes place during the charge transfer.

Further, the conventional video camera is designed for continuous photographing and a satisfactory image signal cannot be obtained if only one shot is desired to be photographed.

Further, when the image pick-up device is provided with a video monitor, it is impossible to confirm the one shot picture image.

SUMMARY OF THE INVENTION

It is, accordingly, an object of the present invention to provide an improved image pick-up device free from the above shortcomings.

It is another object of the present invention to provide an image pick-up device in which smear is hard to take place.

It is further another object of the present invention to provide an image pick-up device which can obtain a proper picture image signal even for a one-shot photographing.

It is further another object of the present invention to provide an image pick-up device in which a monitered picture image is not disturbed when continuous photographing and one-shot photographing are changed over therebetween.

It is further another object of the present invention to provide an image pick-up device by which the image information obtained from the one-shot photographing can be confirmed by the monitor.

One of the main features of the present invention is that the scanning period of the image pick-up element is made constant also for the still, namely the one-shot, mode, in order to achieve such various purposes. Thus, it is remarkably easy to synchronize the whole system.

Another feature of the present invention is that a shutter for the still photographing is provided, that the shutter is opened during the continuous mode and closed for a certain predetermined time during the still mode, and that in order to largely decrease smear, the shutter is not opened until the charge in the light sensing part, after the shutter closes, has been transferred to a non-light-receiving part. Further, a switch (trigger switch) for starting the still mode is provided in such a manner that the clocking for controlling the shutter closing is started after the first transfer signal after the shutter operation is obtained so that the synchronization for scanning the image pick-up elements is not disturbed. Further, in accordance with the present invention, a stop means is provided for stopping the driving, such as for the scanning of the above image pick-up elements, since the first transfer signal after the operation of the still mode start switch till the first transfer signal after the shutter closing, so that even during the still mode, the scanning synchronization signal is not disturbed, whereby after the still mode the continuous mode can be quickly resumed.

Further, the device is so designed that the exposure parameters return to the initial states thereof when the exposure parameters are changed over only during the still mode and the continuous mode is again resumed so that the image on the monitor is stabilized. Further, a memory means for memorizing the image output from the image pick-up means during the continuous mode is provided in such a manner that the memory is reset periodically, and when the mode is changed over to the still mode, said reset is prohibited, whereby the content of the memory means is led to the monitor means so that even if a short time still mode is inserted in the continuous mode, the monitoring is not disturbed.

Further, in accordance with the present invention a means for periodically sample holding a part of the output of the image pick-up means during the continuous mode is provided in such a manner that the output is made use of as the object brightness information, while by stopping the sampling along with the change over into the still mode, the information during the continuous mode can be successively used.

According to one embodiment of the present invention, the periodical storage of the charge in the light sensing part, the periodical transfer of the charge in the light sensing part is accomplished, and the light incidence upon the above image sensor is prohibited by the shutter at least during the above transfer period in such a manner that in this way smear also at the time of the continuous photographing can ba avoided.

Further in accordance with another embodiment of the present invention, the shutter is periodically closed in synchronism with the driving period of the above image sensor, while the shutter closing time is made to correspond to the transfer time of the above image sensor.

Further, in accordance with further another embodiment of the present invention, besides the above features, by changing the duty cycle during the above shutter closing time, the quantity of the image information stored on the light sensing surface of the image sensor is changed.

Further, in accordance with another embodiment of the present invention, the synchronization signal generating means is changed by the operation of the switch means when the continuous mode is changed over into the one-shot photographing, or the still, mode in order to carry out a completely different new storage and scanning from the previous scanning period.

Consequently, the still photographing can be carried out immediately after the triggering.

Other purposes and features of the present invention will be clear from the description hereinbelow with reference to the accompanying drawings.

DESCRIPTION OF THE PREFERRED EMBODIMENTS

Figure 1:
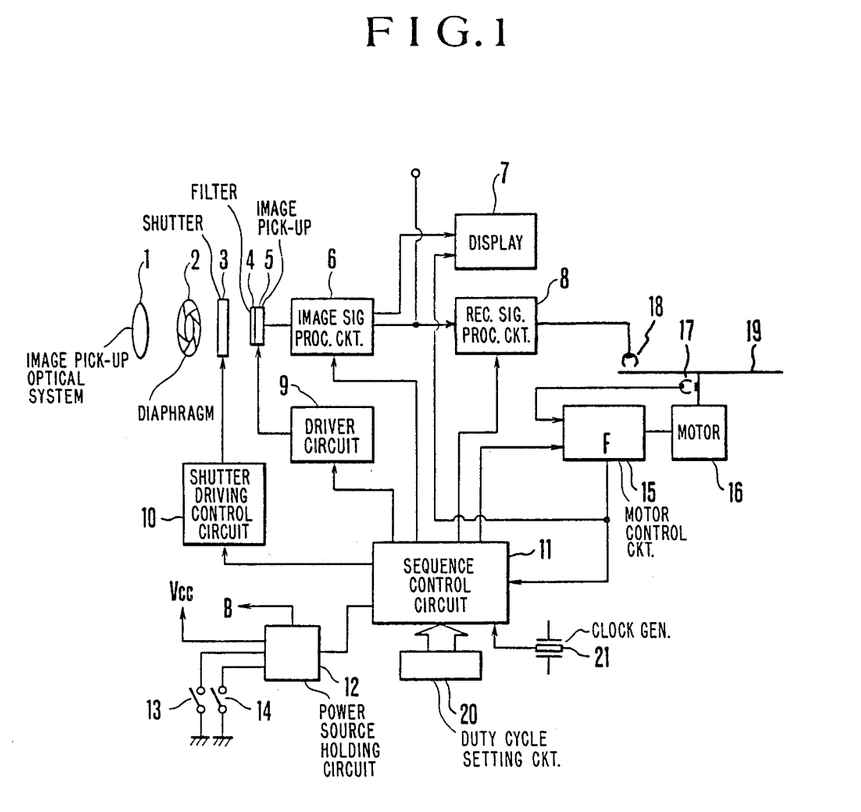
FIG. 1 shows a block diagram of an example of the image pick-up of the invention.

Below, the present invention will be explained in detail according to the drawings of the embodiments hereof. FIG. 1 shows a block diagram of an embodiment of the image pick-up device of the present invention. In FIG. 1, 1 is an image pick-up optical system, 2, is a mechanical or physical property diaphragm means and 3 is a mechanical or physical property shutter means which can be used in common with the diaphragm means 2. 4 is a color filter, 5 is an image pick-up device, 6 is an image signal processing circuit for converting the output of the image pick-up device 5 into a proper form of signal for monitoring by a display device 7, 8 is a recording signal processing circuit for converting the output of the circuit 6 into a proper form of signal for recording, 9 is a driver circuit for supplying a pulse needed for scanning, the transfer, the reading out, the charge clearing and so on, 10 is a shutter driving control circuit for controlling the opening and closing the shutter means, 11 is a sequence control circuit for controlling the drive timing of the whole image pick-up device such as the above image signal processing circuit 6, the recording signal processing circuit 8, the driver circuit 9. the shutter drive circuit 10, a motor control circuit 15, 12 is a power source holding circuit, 13 is a switch to be closed with the first stroke of a 2 stroke switch and 14 is a switch to be closed with a second stroke thereof, whereby, by closing the switch 2, current supply is started and the image is monitored by the display device 7, while by closing the switch 14, recording is started.

Vcc is a power source and B is a power source line to each circuit. Further, 15 is a motor control circuit, 16 is a motor to be controlled in the rotation speed and the phase by the motor control circuit 15, 17 is a detecting head for detecting the rotation phase of the motor, 18 is, for example, a magnetic head for recording the output of the above recording signal processing circuit 8, and 19 is a magnetic disc as the recording medium on which the signal is recorded by the magnetic head 18. 20 is a duty cycle setting circuit of the present invention for setting the closing time of the shutter 3, and 21 is a clock generator.

Figure 2A:
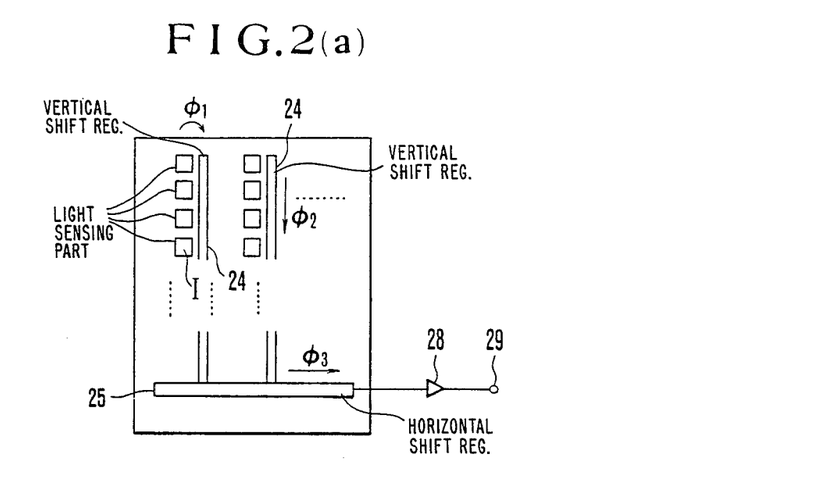
FIGS. 2(a) and (b) show an example of the image pick-up device applicable to the present invention.
Figure 2B:
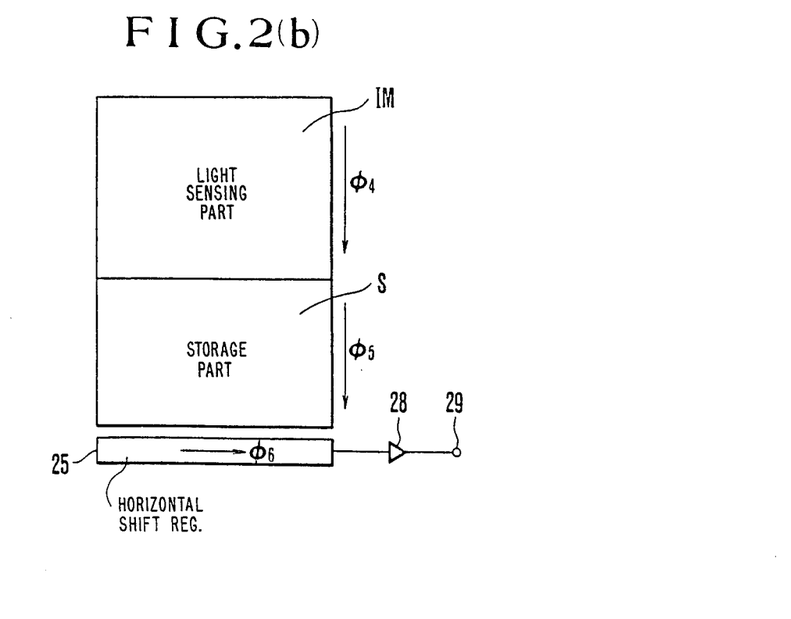

FIGS. 2(a) and (b) show, respectively, an example of the image pick-up device 5 is applicable to the embodiment in FIG. 1, whereby FIG. 2(a) shows an interline transfer type CCD, while FIG. 2(b) shows a frame transfer type CCD. It should be noted that the image pick-up device 5 applicable to the present invention is not limited to the above.

In FIG. 2, I is a light sensing part, 24 is a vertical register, 25 is a horizontal register; IM is a light sensing part and S is a storage part which is totally shaded. 28 is a power amplifier and 29 is an output terminal. $\phi 1$ is a pulse for shifting the charge in the light sensing part I to the vertical shift register 24, $\phi 2$ is a vertical shift pulse, $\phi 3$ and $\phi 6$ are horizontal shift pulses, $\phi 4$ is a transfer pulse for transferring the charge in the light sensing part IM into the storage part S, and $\phi 5$ is a pulse for transferring the charge in the storage part S to the horizontal shift register 25.

Figure 3:
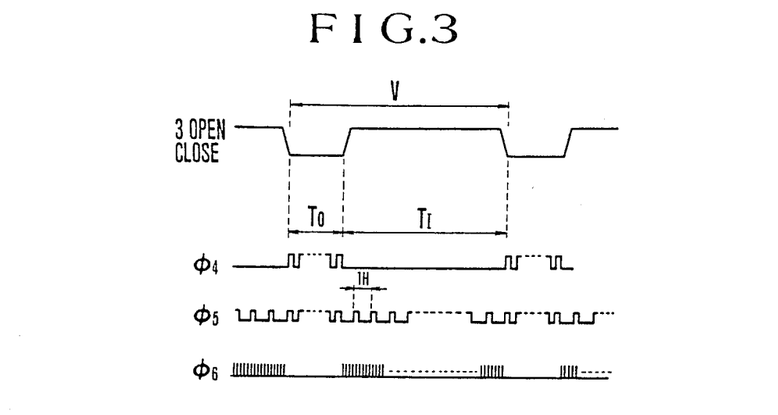
FIG. 3 shows the timing of the operation of the important part of the first embodiment of the present invention.

FIG. 3 shows the operation timing of the first embodiment of the present invention. Hereby, by operating the switch 13, pulses, like $\phi 4$–$\phi 6$ in FIG. 3, are supplied from the drive circuit 9 to the frame transfer type CCD as shown in FIG. 2 in accordance with a clock of the generator 21.

When, for example, 1H is a period for one horizontal scanning of the TV signal, the time $T_0$ corresponds to the vertical blanking period of about 20 H, whereby, the time $T_I$ is one vertical scanning period of, for example, 262.5 H, while the time V is one vertical scanning period of, for example, about 1/60 sec.

Because, as is shown in FIG. 3 in accordance with the present invention, the shutter 3 is closed at least during the transfer period of the frame transfer type image pick-up element 5 by the shutter drive circuti 10, it can be prevented that noise is imparted to the charge formed in the light sensing part IM of the image pick-up element and transferred to the storage part S which improves the picture quality. Further, since the shutter 3 is closed during the transfer period, there is no fear of smearing and it is possible to prolong the transfer time during the vertical blanking period. Consequently, the charge in the CCD is hard to assume the stopped state and an irregular dark current can be decreased.

Figure 4A:
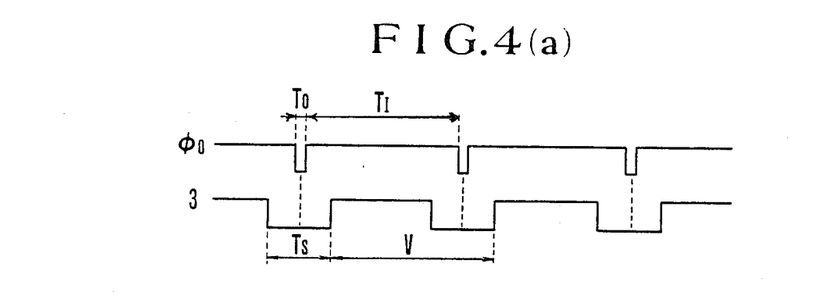
FIGS. 4(a) and (b) show the timing of a second embodiment.
Figure 4B:
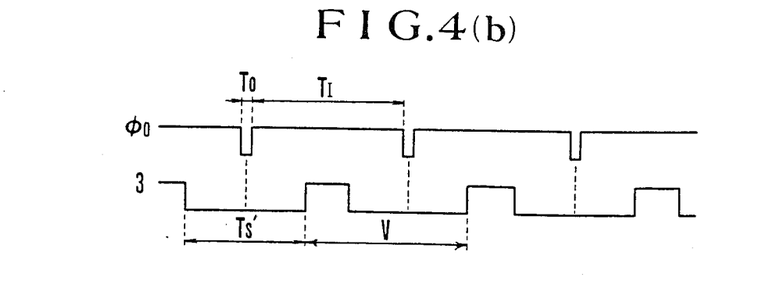

FIGS. 4(a) and 4(b) show a second example of the present invention. In FIGS. 4(a) and 4(b), $\phi 0$ is the vertical blanking pulses including the vertical synchronization signal when the pulses $\phi 4$ and $\phi 5$ are supplied as is shown in FIG. 3, while the level of the pulse $\phi 0$ is low, the charge in the light sensing part IM is transferred to the storage part S. Futher, during the vertical scanning period $T_I$, the charge in the storage part S is read out by the pulses $\phi 5$ and $\phi 6$ at the television rate, while, during this period, a new field signal is stored in the light sensing part IM.

In accorance with the present embodiment, the shutter 3 is closed by the shutter driving circuit 10 in synchronism with this synchronization signal $\phi 0$. Further, its closing period Ts is set as Ts/V by the duty cycle setting circuit 20 in FIG. 1. Further, the present embodiment is synchronized in such a manner that a middle of the shutter closing period Ts corresponds with that of the synchronization signal $\phi 6$.

Consequently, the time (V−Ts) is the incident time of the picture on the light sensing part IM of the CCD and the substantial storage time is controlled. Further, the CCD is normally driven at the television signal rate so that a standard television receiver can carry out the reproduction.

FIG. 4(b) shows an example in which the duty cycle of the opening and the closing of the shutter 3 is varied, whereby the time (V−T's) is shortened.

Figure 5A:
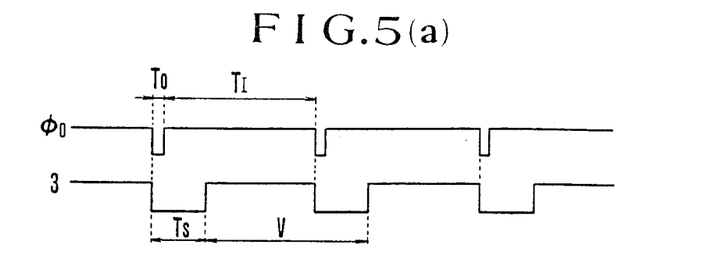
FIGS. 5(a) and (b) show the timing of a third embodiment.
Figure 5B:
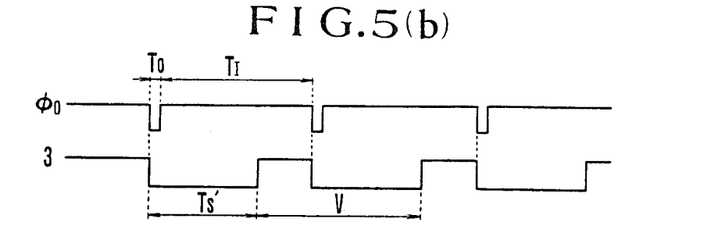

FIGS. 5(a) and 5(b) show the timing of a third embodiment of the present invention. The difference between the present embodiment and the second one is that the duty cycle Ts/V of the shutter 3 closing is varied while the start timing of the shutter 3 closing is synchronized with the rising up of the signal $\phi 0$.

Figure 6A:
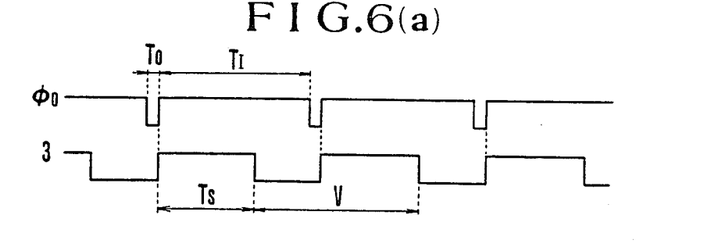
FIGS. 6(a) and (b) show the timing of a fourth embodiment.
Figure 6B:
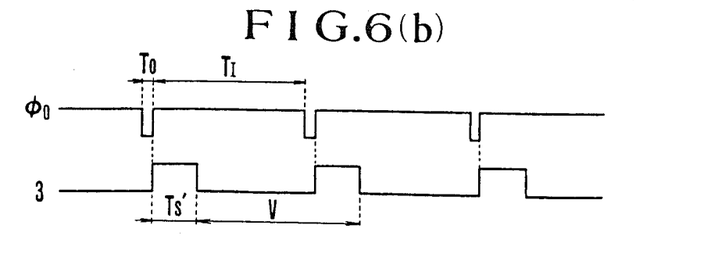

FIGS. 6(a) and 6(b) show the timing of a fourth embodiment, which is characterized in that the duty cycle Ts/V is adjusted while the timing of the shutter 3 closing is synchronized with the rising up of the signal $\phi 0$.

Figure 7:
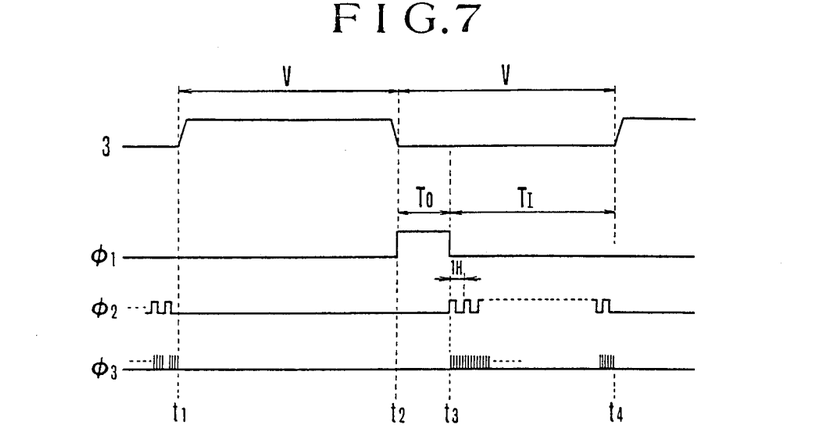
FIGS. 7 through 9 show, respectively, the timing of a fifth to a seventh embodiment.

FIG. 7 shows the timing of a fifth embodiment of the present invention, which can be applied to such an image pick-up device as obtaining the signal for one field intermittently at an interval of 1/60 sec. Further, the image pick-up element 5 used here is the interline transfer type CCD shown in FIG. 2(a).

In case of the present invention, the shift pulse $\phi 1$ is supplied from the drive circuit 9 at every 1/30 sec. during the time $T_0$ corresponding to the vertical blanking period and after that, the signals $\phi 3$ of the number of the horizontal picture elements are supplied for one pulse $\phi 2$ so as to carry out the reading out. Consequently, the charge stored in the light sensing part I during the time between t1 and t2 is transferred to the vertical shift register 24 during the time between t2 and t3 and read out during the time between t3 and t4 corresponding, namely, to the next vertical scanning period so as to be outputted.

Figure 8:
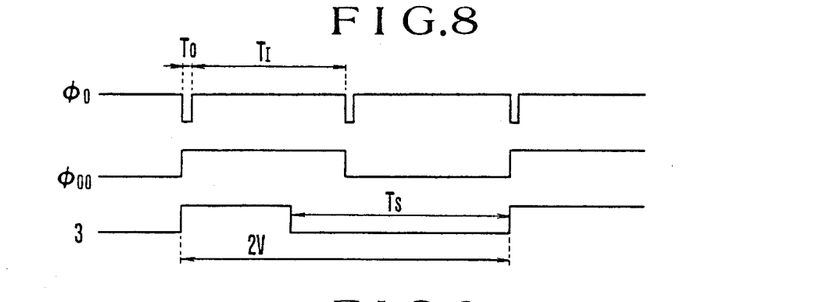
Figure 9:
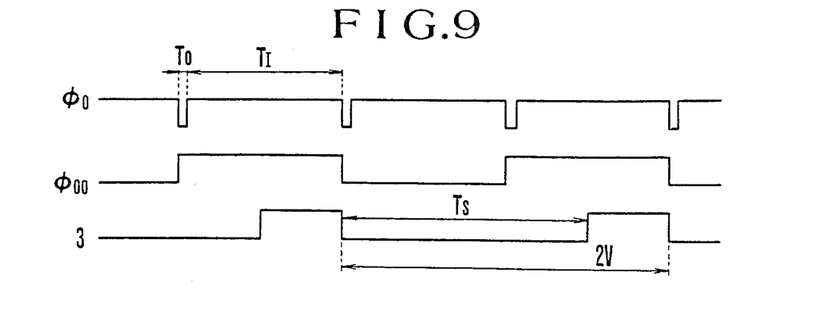

FIGS. 8 and 9 show the timing of a sixth embodiment and a seventh embodiment, respectively, of the present invention. The difference between the present embodiment and the fifth one is that the synchronization timing for the periodical control of the shutter 3 is different.

Further, the image forming time can be controlled by varying the duty cycle Ts/2V of the shutter 3 closing by the setting circuit 20.

The members having the same numbers as those in FIGS. 3-7 are the same members. $\phi 00$ is the pulse $\phi 0$ divided by two in frequency. The shutter 3 opening in FIG. 8 is synchronized with the rising up of the pulse $\phi 00$, and that in FIG. 9 with the falling down of the pulse $\phi 00$.

As described above in detail, in case of the present embodiment, the shutter 3, is closed at least in synchronism with the periodic transfer of the charge in the image sensor so that it is possible to avoid smear. Further, by varying the duty cycle of the shutter 3 closing, the amount and the time of the image store in the image sensor can be varied, which is effective. Consequently, a high quality picture can be obtained, while it is suited for continuous photographing.

Further, the shutter 3, which can be applied to the present embodiment, can be any one that has a high response. However, a physical property shutter, such as of liquid crystal or PLTZ, is easy to realize.

Further, a mechanical shutter, such as the rotary shutter, is also easy to realize.

Figure 10:
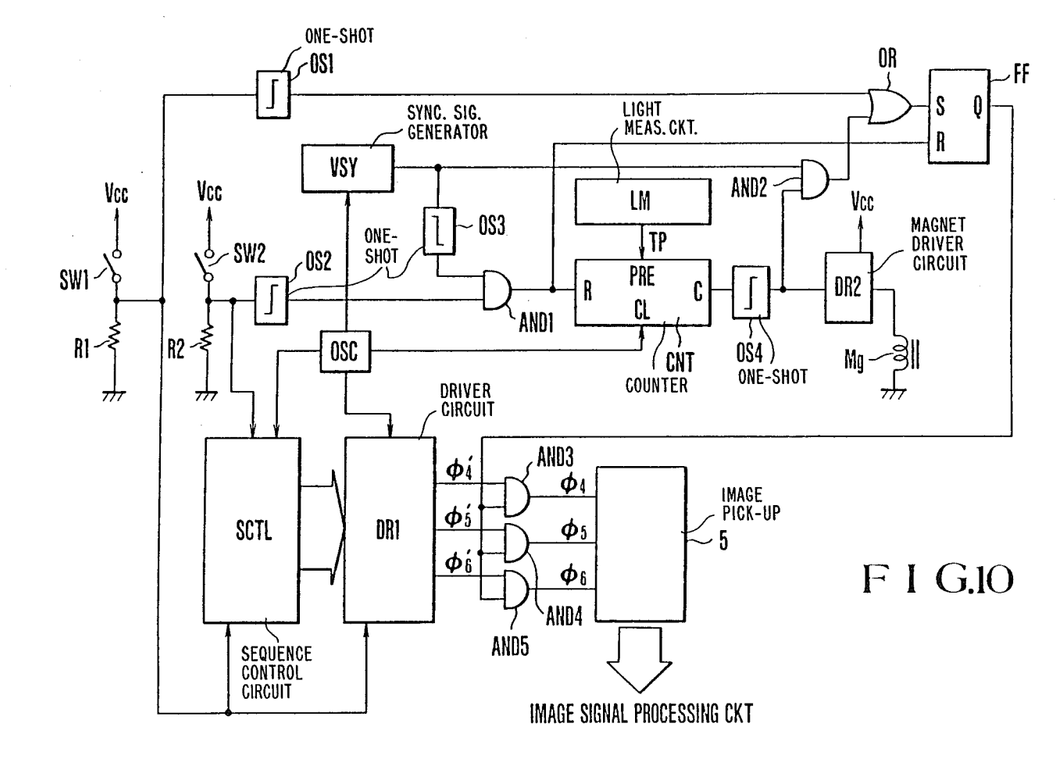
FIG. 10 shows an eighth embodiment of the image pick-up device of the present invention.
Figure 11A:
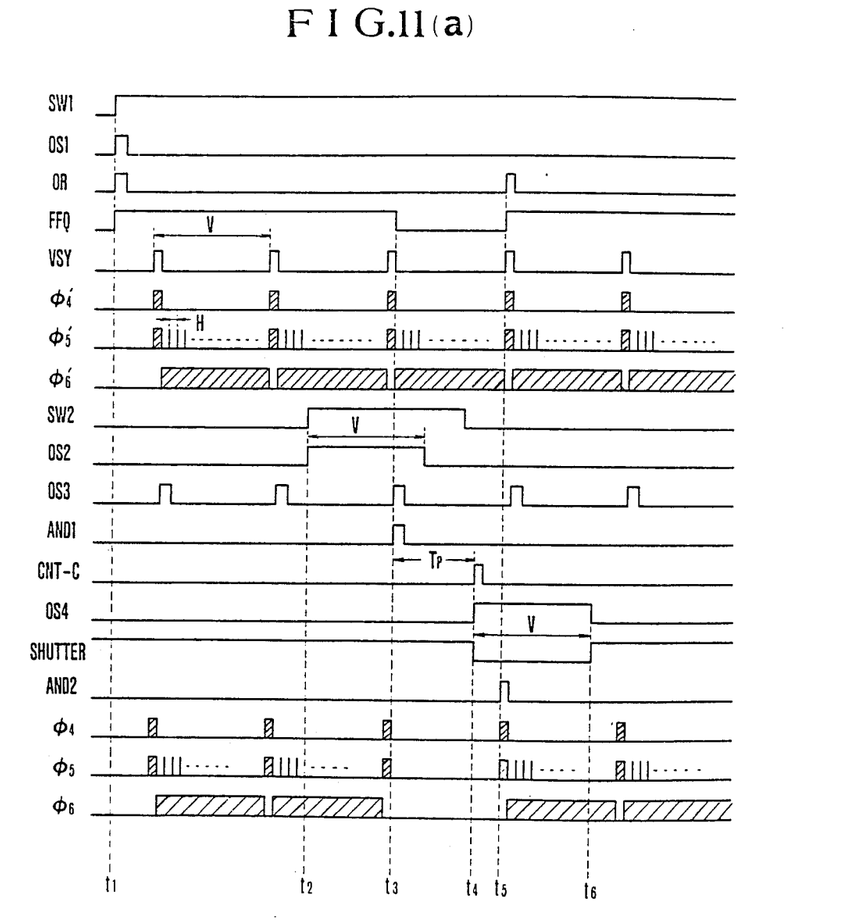
FIGS. 11(a) and (b) show the driving timing of the important parts of the embodiment in FIG. 10.
Figure 11B:
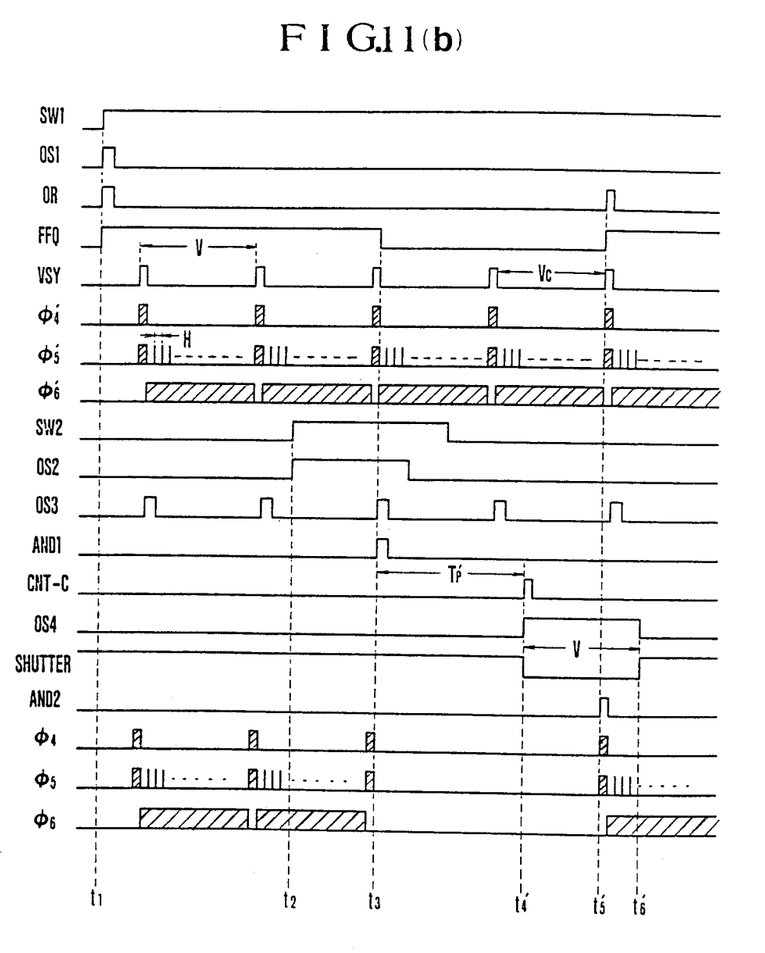

FIG. 10 shows a block diagram of an eight embodiment of the image pick-up device of the present invention. FIGS. 11(a) and 11(b) show, respectively, a timing chart of the circuit in FIG. 10. The obliquely lined parts in FIGS. 11(a) and 11(b) are pulse groups. In FIG. 10, SW1 is a continuous mode switch and SW2 is a still mode switch, whereby the switch SW1 is closed by the first stroke of, for example the 2 stroke button switch, while SW2 is closed by the second stroke. OS1 is a one-shot circuit for producing a pulse in synchronism with the rising up of the switch SW1, while OS2 is a one-shot circuit for producing a pulse with a width of V (FIG. 11) in synchronism with the rising up of the switch SW2. VSY is a synchronization signal gernerator for producing intermittent pulses with the frequency V as shown in FIG. 3 with the output of an oscillator OSC. OS3 is a one-shot circuit for producing a pulse in synchronism with the falling down of the output of the synchronization signal generator VSY, AND1-AND5 are AND gates, and CNT is a presettable counter to which present input terminal PRE the output of a light measuring circuit LM is connected, whereby the preset value Tp (FIG. 11) corresponds to the exposure value. Further, R is a reset terminal, CL is a clock input terminal, and C is a carry output terminal for producing the high level pulse when the clocks have been counted up to the preset value. The C terminal is connected to a one-shot circuit OS4 in synchronism with the rising up of the pulse width V. Further, the output of the one-shot circuit OS4 controls a shutter closing magnet Mg via a magnet drive circuit DR 2.

Further, the present embodiment is so constructed that the shutter (not shown) is normally urged by a spring along the opening direction, and only while a current flows through the magnet Mg is the light sensing part (IM in the element in FIG. 2) of the image pick-up element 5 shaded by the closed shutter.

Hereby, the shutter not only can be mechanical but also of physical property. OR is an OR gate and FF is an R-S flip-flop whose Q output controls the AND gates AND3-AND5. SCTL is a sequence control circuit for controlling the sequence of the whole image pick-up device.

DRI is which delivers the driving pulses $\phi'4$–$\phi'6$ as shown in FIG. 11 in accordance with the output of the oscillator OSC when, for example, the device in FIG. 2(b) is used. 5 is the image pick-up device.

FIG. 11(a) shows the timing chart when the preset value has a relation Tp<V.

FIG. 11(b) shows the timing chart when the preset value has a relation Tp'>V.

Below, the operation of the present embodiment will be explained accordance with FIGS. 10 and 11.

When, at the time point t1, the switch SW1 is closed, a current is supplied to each circuit, while the one-shot circuit OS1 produces a pulse so as to set the flip-flop FF. Thus, the driving pulses $\phi'4$–$\phi'6$ produced from the driver circuit DR1 with the output of the oscillator OSC are delivered to the image pick-up element 5 in such a manner that the charge in the light sensing part IM is transferred to the storage part S by the pulses $\phi'4$, $\phi'5$ synchronized with the vertical synchronization signal during the vertical blanking period.

Further, during the vertical scanning period, the next field information is formed in the light sensing part IM, while the previous field information in the storage part S are read out, one by one, by the pulses $\phi5$ and $\phi4$ during this period.

Consequently, continuous photographing is carried out in synchronism with the vertical synchronization signal while SW1 is closed and SW2 is opened.

When the switch SW2, as the still mode switch, is closed, a pulse with the width V is formed in the one-shot circuit OS2. On the other hand, the synchronization signal generating circuit VSY delivers periodical pulses as shown in FIG. 3 which make the light sensing part IM of the image pick-up element 5 produce a high level signal to the storage part S, whereby a pulse synchronized with the falling down of this pulse is obtained by the one-shot circuit OS3. Consequently, the output terminal of the AND gate AND1 delivers a pulse synchronized with the first vertical synchronization signal obtained after the switch SW2 is closed. By this pulse, the counter CNT is reset (at the time point t3) and the clocks are counted for the exposure time Tp preset by the output of the light measuring circuit LM (at the time point t4), when the C terminal delivers one pulse, in synchronism with whose rising up, the one-shot circuit OS4 operates the magnet Mg during the period V, during which the shutter is closed. Hereby, it is desirable in order to avoid smear that the shutter continues to be closed until the first shift pulses $\phi4$ and $\phi5$, after the shutter close, are delivered to the image pick-up element 5. In case of the present embodiment, the closing period is V taking the shutter response into consideration.

Hereby, the flip-flop FF, which has been reset with the closing of the continuous mode switch SW1, is reset with the reset of the counter CNT (at the time point t3) and again set with the vertical synchronization signal obtained after the shutter closing so that the driving pulses $\phi'4$–$\phi'6$ to be delivered to the image pick-up element 5 are cut while the flip-flop FF remains reset.

Namely, until the timing of the first shift pulse after the shutter closing, the driving of the image pick-up element 5 is suspended. The same thing can be said when the exposure time Tp'>V as shown in FIG. 11(b). Consequently, the charge is the light sensing part whose exposure time is controlled with the shutter closing, is read out synchronized with the synchronization signal after the shutter closing so that an unnecessary signal is never recorded even when used in combination with the recording device. The read out timing is always a constant (V) or integer so that the whole device can be synchronized easily. Thus, the change over to the continuous mode can be made smoothly. Further, smear is difficult to take place and the one-shot picture with high S/N can be obtained, which is effective.

Figure 12:
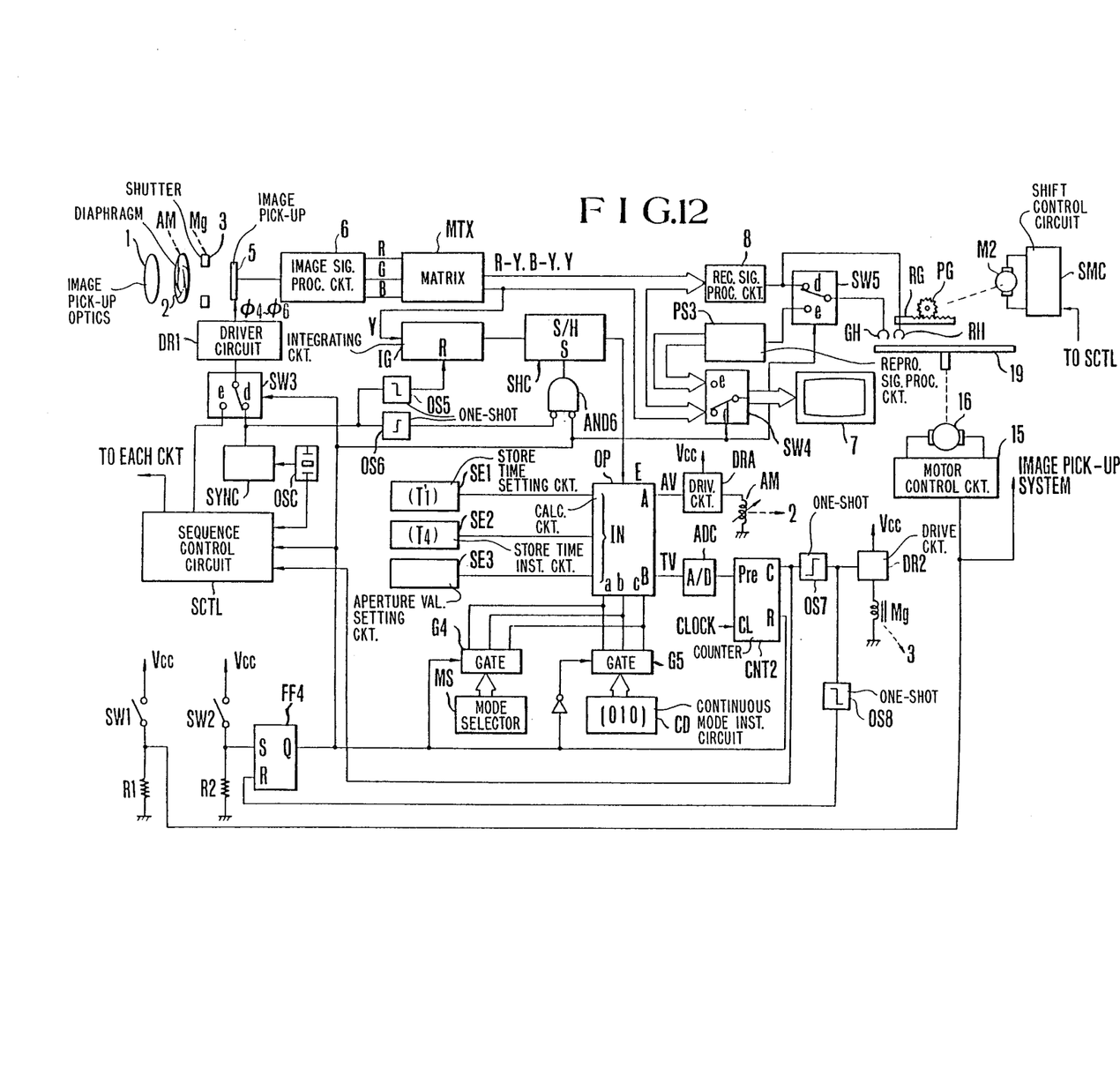
FIG. 12 shows a block diagram of an embodiment of the image pick-up device of the present invention.

FIG. 12 shows a block diagram of the third embodiment of the image pick-up device of the present invention.

Figure 13:
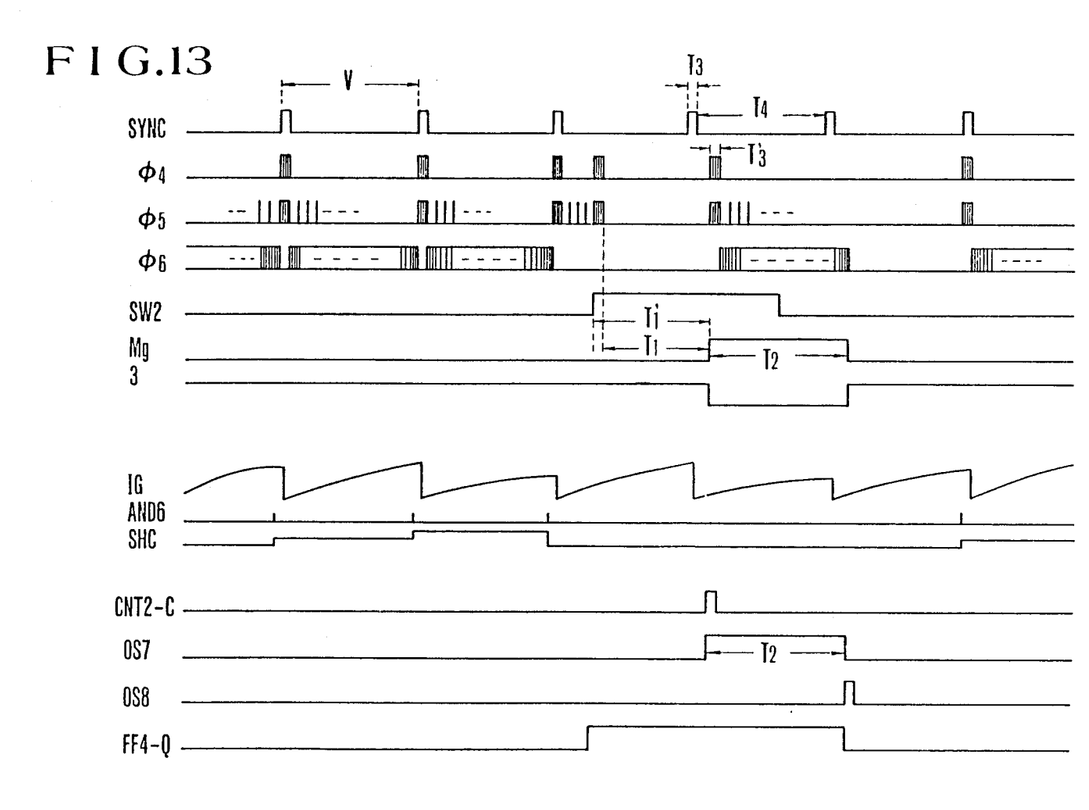
FIG. 13 shows the timing of the important parts of the circuit in FIG. 12.

FIG. 13 shows the timing of the important part in FIG. 12.

Figure 14:
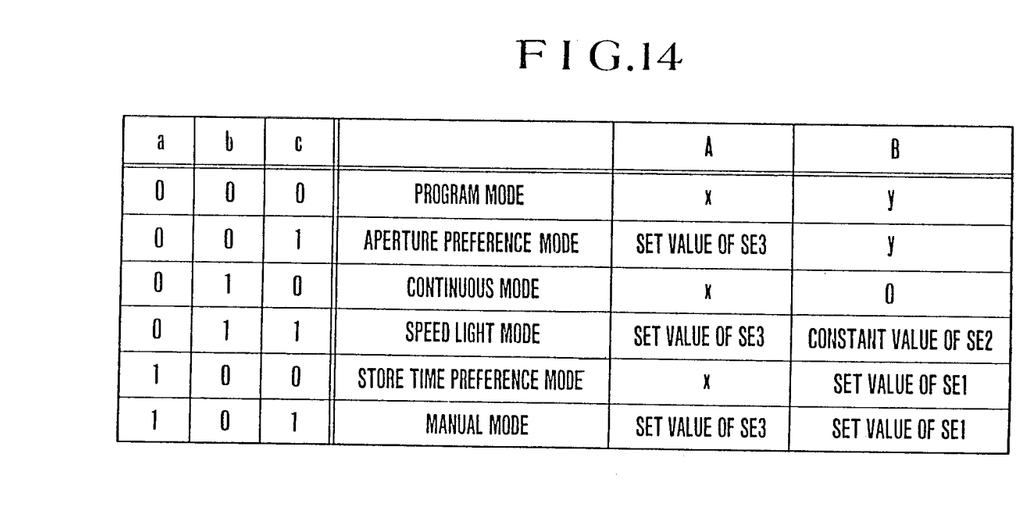
FIG. 14 shows the input-output of the calculation circuit OP.

FIG. 14 shows the logic diagram of the mode selector and the continuous mode instruction circuit in FIG. 1.

In the drawing, 1 is an image pick-up optics, 2 is the diaphragm, 3 is the shutter, 5 is the solid image pick-up element, 6 is the processing circuit, MTX is a matrix circuit for converting the outputs R>G and B of the processing circuit 6 into color difference signals (R−Y), (B−Y) and the brightness signal Y, 8 is the recording signal processing circuit. RH is a recording head and RG and PG are a rack gear and a pinion gear for shifting the head RH by one track.

M2 is a pulse motor for driving the pinion gear PG and SMC is a shift control circuit for carrying out the synchronous control of the pulse motor M2, for example, with the vertical synchronization signal from the sequence control circuit SCTL to be explained later.

19 is the recording medium, such as the magnetic disc, which is rotated by the motor 16, for example, at 3600 rpm. 15 is the disc motor control circuit for controlling the rotation of the motor. Hereby, the output of the matrix circuit MTX can be connected to the monitor device 7 via the switch SW 4. DR1 is the driver circuit for producing the driving pulses for the storage, the transfer and the read out of the image pick-up element 5 and is synchronously controlled by the output of a synchronization signal producing circuit SYNC or the sequence control circuit SCTL. OSC is the standard signal generator. IG is an integrating circuit for integrating the Y signal out of the output of the matrix circuit MTX and R is a reset terminal therefor. The reset terminal R is connected to the output terminal of a one-shot circuit OS5 for forming a pulse with the falling down of the output of the synchronization signal generator SYNC as shown in FIG. 13.

SHC is a sample-and-hold circuit of the present invention for sampling the output of the above integrating circuit IG at a certain determined timing until the next sampling time. S is the sample signal input terminal thereof to which the output of the one-shot circuit OS6 for forming the pulse in synchronism with the rising up of the output of the above synchronization signal generator SYNC is connected via the AND gate AND6.

The output of the sample-and-hold circuit SHC is delivered to a calculating circuit OP so as to be calculated with the output of a store time setting circuit SE1, in which the value can be manually input, or that of the fixed store time instructing circuit SE2 or that of the aperture value setting circuit SE3, in which the value can be manually set in such a manner that, as is shown in FIG. 14, the output A or B is selectively delivered in accordance with the state of the control inputs a–c.

Hereby, to the control input terminals a–c the output of a mode selector MS and that of a continuous mode instructing circuit CD are connected via gate circuits G4 and G5. Further, the gate circuits G4 and G5 are controlled by the Q output of an RS flip-flop FF4 in such a manner that when the level of the Q output is high, G4 opens and G5 closes. When it is low, G4 closes and G5 opens.

The A output of the calculation circuit OP is connected to a coil of the ampere meter AM via a driving circuit DRA in such a manner that the amount of the current supplied to the meter AM is varied in accordance with the level of the A output. Further, the movable part of the ampere meter AM is constructed so as to vary the aperture value of the diaphragm 2.

The B output terminal of the calculation circuit OP is connected to the present input terminal Pre of the presettable counter CNT2 via an A/D converter ADC, while to the clock input CL of the counter CNT2, the output of the above standard generator OSC is connected. C is a output terminal for producing a high level pulse when the clocks have been counted up to the set value and, R is the reset input terminal connected to the Q output of the flip-flop FF4. Further, the output terminal C is connected to the shutter drive circuit DR2 via a one-shot circuit OS7 synchronized with the rising up of a certain determined pulse width (T2 in FIG. 13) so as to supply current to the magnet Mg in order to close the shutter 3 only while the level of the one-shot circuit OS7 is high. Further, different from the conventional shutter for the silver halide film, the shutter 3 of the present invention is intended to prevent light incident upon the above light sensing part during transportation of the charge in the light sensing part of the image pick-up device 5 to the store zone, being normally urged along the direction along which the shutter 3 is opened and prohibiting the light incident upon the image pick-up element while a current flows in the magnet.

Further, the output of the above one-shot circuit OS is connected to the reset terminal of the above flip-flop FF via the one-shot circuit OS8 in synchronism with the rising up. GH is a reproducing head of the present invention, which can record the image output of the recording signal processing circuit 8 for a certain determined track of the magnetic disk 19 via the siwtch SW5 while the level of the Q output of the above flip-flop FF4 is low, while, when the level of the Q output of the above flip-flop FF4 becomes high, the switch SW5 is changed over to the e side in such a manner that the image signal is led to a reproducing signal processing circuit PS3 so as to be monitored by the monitor device 7 via the switch SW4. Hereby, the switches SW3–SW5 are changed over to the e side when the level of the Q output of the flip-flip FF4 is high, and to the d side when the level of the Q output is low. Further, the flip-flop FF4 is designed so as to be set when the still mode start switch SW2 is closed. Further, SW1 starts the above motor control circuit 15 when closed by the continuous mode start switch.

To the remaining input terminal of the above AND circuit AND6, the Q output of the above flip-flop FF4 is connected. Further, in the still mode of the present invention, the sequence control circuit SCTL delivers the driving control signal to the driver circuit DR1 instead of the above synchronization signal generating circuit SYNC, and in the continuous mode, the vertical synchronization signal for periodically shifting the head RH by the shift motor control circuit SMC.

Below, the operation of the block diagram in FIG. 12 will be explained in accordance with FIGS. 12–14. Hereby, the image pick-up device 5 of the type as shown in FIG. 2(b) is used. When the continuous mode switch SW1 is closed, the motor control circuit 15 starts to operate so as to rotate the disc 19 and drive the circuit of the image pick-up sytem, the shutter 3, and diaphragm 2, while, from the synchronization signal generating circuit SYNC, the synchronization signal is produced, for example, at the period of V as shown in FIG. 13. This period V is set, for example, at 1/60 sec. This synchronization signal is delivered to the driver circuit DR1 via the switch SW3 so as to produce the pulses $\phi 4$–$\phi 6$ as shown in FIG. 13.

Further, in the image pick-up element 5, as shown in FIG. 2(b), an overflow drain (not shown) is provided near the horizontal register 25 and a barrier wall is provided between the overflow drain and the horizontal register 25 so that when no reading out by the pulse $\phi 6$ is not carried out but only the vertical transfer by $\phi 4$ and $\phi 5$ is carried out, the surplus charge is absorbed from the horizontal register 25 by the overflow drain. The signal read out by the pulses $\phi 4$–$\phi 6$ is delivered to the monitor device 7 via the process circuit PS1, the matrix circuit MTX and the d side of the switch SW4 and repeatedly recorded by one field on a certain determined track of the disc 19 via the recording signal processing circuit PS2, the d side of the switch SW5 and the head GH. Further, the rotation period of the disc 19 is controlled at the synchronization signal period V or the integer of V by the motor control circuit 15 is period and phase. Further, an erasing head (not shown) is provided on the same track before the reproducing head GH.

Further, in the continuous mode, for example, the Y signal output of the matrix circuit MTX is periodically integrated by the integrating circuit IG to be reset at every rising up of the synchronization signal, whereby, the integration output is sampled immediately before the resetting, namely, at every rising up of the synchronization signal and held till the next sampling. Consequently, the output of the sampleand-hold circuit SHC corresponds to the TTl (Through the Lens) light measurement value, although delayed by the period V from the actual time. The light measurement value E, which is inputted into the calculation circuit OP, is calculated with the input information from the 1N terminal so as to deliver the combined output as is shown in FIG. 14 from the terminals A and B. The outputs from the terminals A and B respectively correspond to Av (aperture value) and Tv (time value) obtained, for example, from APEX (additive system of photographic exposure), whereby x and y are variables.

To the control terminals a, b and c of the calculation circuit OP, the logic inputs, as shown in FIG. 14, are delivered from the continuous mode indication circuit CD or the mode selector MS. For example, when the continuous mode switch SW1 is closed and the still mode switch SW2 is opened, namely, in case of the continuous mode, the gate G5 is opened and the gate G4 is closes so that the output value (010) of the circuit CD is delivered to the input terminals a–c. Thus, as shown in FIG. 14, the signal x, corresponding to Av, is delivered from the A terminal so as to control the diaphragm 2. There is no output from the B terminal. As described above, in case of the continuous mode, the diaphragm 2 is controlled in accordance with the periodically sample held light measurement value, while the storing time of the image pick-up element 5 is fixed at the time T4. As explained above, the image signal is monitored and recorded on a certain determined field memory track. Further, the motion picture is recorded by the recording head by changing the tracks at every field, one by one.

When the still mode switch SW2 is closed after the proper mode is selected, as shown in FIG. 14, by the mode selector MS and the storing time and the aperture value are set by SE1 and SE3, the flip-flop FF4 is set so that to the control inputs a–c of the calculation circuit OP, the data from the selector MS is delivered and the level of the Q output of FF4 becomes high so as to close the AND6, in such a manner that the sampling in the sample-and-hold circuit SHC stops and the light measurement value E in the continuous mode is maintained. Further, SW3–SW5 are changed over to the e side, by the signal produced along with the setting of the flip-flop FF4, and the driver circuit DR1 delivers the driving pulses $\phi4$, $\phi5$, as is shown in FIG. 13. Thus, the unnecessary charge in the light sensing part is cleared. Further, when the counter CNT2 is reset and the storing time corresponding to the preselected mode and the set value passes, a pulse is delivered from the C terminal to the sequence control circuit SCTL, whereby the transfer of the charge from the light sensing part IM of the image pick-up element 5 to the storage part S and the reading out of the storage part S are started with the pulses $\phi4$–$\phi6$ via the driver circuit DR1. Further, in synchronism with the rising up of the pulse from the C terminal, the one-shot circuit OS7 delivers a pulse with the pulse width T2 as shown in FIG. 13, during which time the magnet Mg operates to close the shutter so as to prevent light incident upon the light sensing part IM. In this way, no light is incident at least during the charge transfer time (T3) from the light sensing part IM to the storage part S so that smear is avoided. Further, in case of the present embodiment, the shutter 3 is closed during T3 longer than the transfer time T3', because it is difficult to make the shutter 3 response to such a short time as T3' and there takes place no difficulty if the time is longer than T3'. The reset signal of the flip-flop FF4 is formed by the one-shot circuit OS8 in synchronization with the falling down of the oneshot circuit OS7, so that it is desirable that the shutter closing time T2 is longer the the time V needed for the reading out. The reason is that there is a danger that a new picture is transferred to the storage part S during the reading out of the signal in the still mode 2 if the continuous mode is resumed too easily. In case of the present embodiment, V=T2. Further, in case of the present embodiment, the still photographing state is maintained even if the switch SW2 is closed for a moment until the reset input of the flip-flop FF4 is delivered for the still mode photographing by the switch SW2.

Further, along with the closing of the switch SW2, the image signal delivered from the matrix circuit MTX to the monitor device 7 is changed over into the signal recorded in the continuous mode one field by one field. Consequently, even when the continuous mode is changed over to the still mode, the monitor 7 continues to display the image immediately before the change over and there is no fear that the image shaded disappears or is disturbed.

Further, although in case of the present embodiment as the field memory, a certain determined track of the magnetic disc is exclusively used, the present invention is not limited to the analog memory as above but after the output of the matrix circuit is normally analog to digitally converted, the digital memory is once memorized and renewed at each field. In this case, along with the change over into the still mode, the content of the memory can be digital to analog converted and led to the monitor 7. Further, in case of the present embodiment, the Y signal is obtained from the output of the matrix circuit, whereby it can be composed of the output of the processing circuit 6. Further, it is possible to use a part of the light sensing part IM of the image pick-up element exclusively for smearing the light measurement value by integrating the output.

Further, the image pick-up device is not limited to the frame transfer type CCD as is shown in FIG. 2(b) but can be the interline transfer type CCD.

What we claim is:

1. An image pick-up device comprising:
   (a) image pick-up means for converting an optical image into an electrical signal;
   (b) control means having a first mode for causing said image pick-up means to generate signals for one image and a second mode for causing said image pick-up means to intermittently generate signals for a predetermined plurality of images; and
   (c) exposure means for exposing said image pick-up means for a predetermined limited period in said first mode of said control means, and exposing said image pick-up means all the time in said second mode of said control means.

2. A device according to claim 1, wherein said signals for one image is one television field signal.

3. A device according to claim 1, wherein said signals for one image is one television frame signal.

4. A device according to claim 1, further comprising drive means for reading out said electrical signal from said image pick-up means at a predetermined interval of time.

5. An image pick-up device comprising:
   (a) image pick-up means for converting an optical image into an electrical signal;
   (b) control means having a first mode for causing said image pick-up means to generate signals for one image and a second mode for causing said image pick-up means to intermittently generate signals for a predetermined plurality of images;
   (c) exposure condition setting means for setting different exposure conditions for said image pick-up means when said control means is in the first mode and when said control means is in the second mode; and
   (d) exposure control means for controlling the exposure condition for said image pick-up means on the basis of an output of said setting means.

6. A device according to claim 5, wherein said signals for one image is one television field signal.

7. A device according to claim 5, wherein said signals for one image is one television frame signal.

8. An image pick-up device comprising:
   (a) an image pick-up means for converting an optical image into an electrical image signal;
   (b) recording means for recording said electrical image signal of said image pick-up means in response to actuation of an operating member; and
   (c) display means for automatically reproducing and displaying a part of said electrical image signal recorded by said recording means for a predetermined period following said actuation of said operating member.

9. A device according to claim 8, wherein said display means is able to display motion picture images.

10. A device according to claim 8, further comprising erasing means for erasing recorded contents of said recording means.

11. A device according to claim 10, wherein said erasing means performs an erasure periodically.

12. An image pick-up device comprising:
(a) an image pick-up means for converting an optical image into an electrical signal;
(b) sample-and-hold means for sampling and holding at least a part of said electrical signal of said image pick-up means in response to actuation of an operating member; and
(c) control means for controlling an exposure condition against said image pick-up means by use of an output of said sample-and-hold means.

13. A device according to claim 12, further comprising mode control means having a first mode for causing said image pick-up means to form signals for one image, and a second mode for causing said image pick-up means to intermittently form signals for a plurality of images.

14. A device according to claim 13, wherein said sample-and-hold means performs the sampling and holding along with change over from said second mode to said first mode.

15. An image pick-up device comprising:
(a) image pick-up means for converting an optical image into an electrical signal;
(b) control means having a first mode for causing said image pick-up means to form signals for one image and a second mode for causing said image pick-up means to intermittently form signals for a plurality of images; and
(c) two switch members having a first switch for selecting said second mode and a second switch for selecting said first mode, said first switch operating in advance of said second switch.

16. An image pick-up device comprising:
(a) image pick-up means for converting an optical image into an electrical signal;
(b) recording means for recording said electrical signal of said image pick-up means;
(c) two switch members having a first switch for selecting a second mode and a second switch for selecting a first mode, said first switch operating in advance of said second switch; and
(d) control means having said first mode for causing recording of one image from the image pick-up means, and a second mode for causing recording of a plurality of images from said image pick-up means.

17. An image pick-up device comprising:
(a) image pick-up means for converting an optical image into an electrical signal;
(b) trigger signal generating means for generating a trigger signal for starting accumulation of predetermined picture images in said image pick-up means;
(c) read out means for clearing the picture image signals in said image pick-up means in response to the trigger signal, and for converting optical images into electrical signals and accumulating said signals in said image pick-up means for a predetermined period and reading out said accumlated electrical signals; and
(d) a shutter for cutting off light incidence on the image pick-up means, said shutter performing light shielding of said image pick-up means while said read out means performs the read-out, and allowing the exposure of said image pick-up means at least when the electrical signal is formed in said image pick-up means.

18. A device according to claim 17, further comprising recording means for recording the electrical signals read out by said read out means.

* * * * *